(12) United States Patent
Pinkhasov

(10) Patent No.: US 9,413,320 B1
(45) Date of Patent: Aug. 9, 2016

(54) PROGRAMMABLE BROAD BANDWIDTH GAIN AMPLIFIER

(71) Applicant: Anadigics, Inc., Warren, NJ (US)

(72) Inventor: Aleksey Pinkhasov, Forest Hills, NY (US)

(*) Notice: Subject to any disclaimer, the term of this patent is extended or adjusted under 35 U.S.C. 154(b) by 8 days.

(21) Appl. No.: 14/524,248

(22) Filed: Oct. 27, 2014

Related U.S. Application Data

(60) Provisional application No. 61/895,868, filed on Oct. 25, 2013.

(51) Int. Cl.
*H03G 3/20* (2006.01)
*H03G 3/30* (2006.01)
*H03F 3/19* (2006.01)
*H03F 3/21* (2006.01)

(52) U.S. Cl.
CPC .............. *H03G 3/3042* (2013.01); *H03F 3/19* (2013.01); *H03F 3/21* (2013.01); *H03F 2200/451* (2013.01)

(58) Field of Classification Search
CPC .................. H03G 3/3026; H03G 1/0088
USPC .................. 330/51, 144, 284; 333/81 R
See application file for complete search history.

(56) References Cited

U.S. PATENT DOCUMENTS

| | | | | |
|---|---|---|---|---|
| 5,646,578 A * | 7/1997 | Loh | ....................... | H03G 3/3047 330/279 |
| 5,909,643 A * | 6/1999 | Aihara | ................. | H03G 1/0088 330/51 |
| 8,130,056 B2 * | 3/2012 | Jansen | ....................... | H03F 1/56 327/308 |

* cited by examiner

*Primary Examiner* — Steven J Mottola
(74) *Attorney, Agent, or Firm* — Kelley Drye & Warren LLP

(57) ABSTRACT

A broadband amplifier in which an amplifier output stage is part of a stepped attenuator where the amplifier output stage can be selectively replaced by, or bypassed by, an attenuator block to produce one step of the stepped attenuator.

19 Claims, 8 Drawing Sheets

PROGRAMMABLE BROAD BANDWIDTH GAIN AMPLIFIER

CROSS-REFERENCE TO RELATED APPLICATION

This application claims benefit of provisional application Ser. No. 61/895,868, filed Oct. 25, 2013, which application is incorporated herein by reference.

BACKGROUND

Programmable broadband gain amplifiers (PGA) are commonly implemented as indicated in FIG. 1 with an input amplifier gain stage (IS) 10 that is followed by a programmable stepped attenuator (ATT) 20 that is followed by an output amplifier gain stage (OS) 80.

Such a topology is quite useful. At low attenuation levels, this topology allows separate blocks to independently control the most important specifications of the system. If the system is properly designed, at low attenuation levels, the noise figure is set by the input stage IS; and linearity and output swing are set by the output stage OS. The gain is controlled by the attenuator ATT.

Problems arise at lower gain settings when the programmed attenuation level of the attenuator ATT is significantly higher than the gain of the input stage IS.

The first problem is related to the noise floor specification that many systems require to be maintained at a certain level at high attenuation. Assuming the attenuator ATT is implemented using a π, T or bridged T based resistive attenuator, then at high attenuation levels, the integrated noise power at the output of attenuator ATT is given by equation (1) and the integrated noise power at the output of the system is given by equation (2).

$$NP_{ATT}=10*\log(kTB) \quad (1)$$

$$NP_{OUT}=10*\log(kTB)+10*\log(GAIN_{OS})+NF_{OS} \quad (2)$$

where $GAIN_{OS}$ is the gain of the output stage OS and $NF_{OS}$ is a noise figure of the output stage OS. Since kTB is constant, the output noise power becomes mainly a function of the output stage OS parameters. This fact constrains output stage OS design flexibility.

The second problem arises from the fact that broadband gain amplifiers are commonly used to transmit time division multiple access (TDMA) signals. To conserve power, the broadband gain amplifier is required to be able to turn the amplifiers off in the "Transmit Disable" mode and turn them back on in the "Transmit Enable" mode. Turning amplifiers off and on causes transient disturbances at the output of the amplifier. The specification on Transmit Enable/Disable transient spurious emissions is especially stringent at high attenuation levels. To achieve linearity typically requires the output stage OS is to be biased with a high current with the result that this is a major contributor to output spurious emission.

SUMMARY

This invention minimizes the above described problems by replacing the output stage OS or by turning the output stage off and bypassing it at high attenuation levels. This is achieved by use of an amplifier output stage OS that can be selectively replaced by, or bypassed by, an attenuator block having an attenuation selected to produce one of the attenuation steps. In addition, this offers the additional benefit of a significant reduction in power consumption at high attenuation levels.

Numerous variations may be made in the practice of the invention.

BRIEF DESCRIPTION OF DRAWING

These and other objects, features and advantages of the invention will be more readily apparent from the following Detailed Description in which.

DETAILED DESCRIPTION

Figure 1:
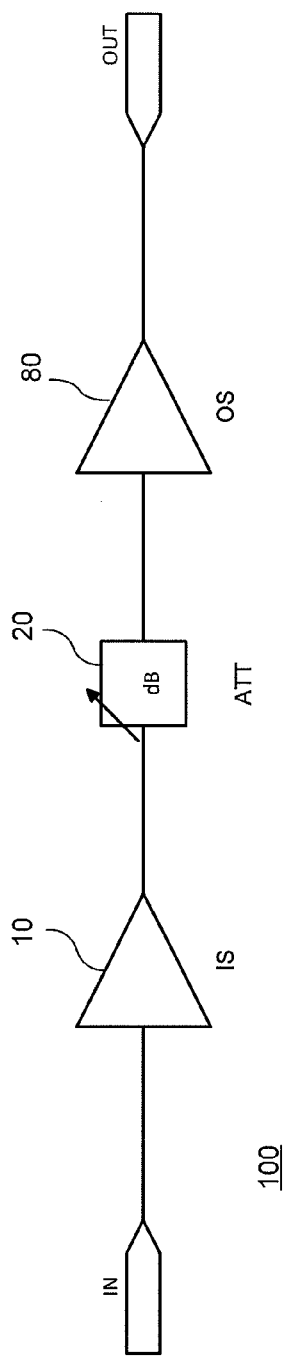
FIG. 1 is a schematic diagram of a broadband gain amplifier.
Figure 2:
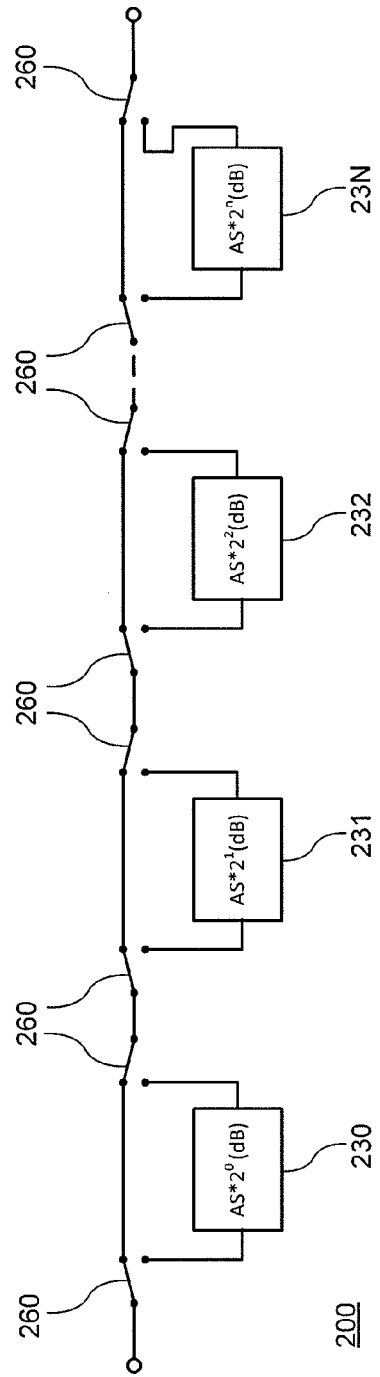
FIG. 2 is a schematic diagram of a binary coded attenuator.

Broad band stepped attenuators are typically implemented as either binary coded attenuators, thermometer coded attenuators or a combination of both. FIG. 2 depicts a binary coded attenuator comprising a plurality of attenuator stages (or steps) 230. 231, . . . , 23N that may be selectively connected in series by appropriate pairs of switches 260. The attenuator stages have attenuation levels that are binary multiples of a minimum attenuation step of AS.

For the binary coded attenuator of FIG. 2, the maximum attenuation level is computed using equation (3):

$$MAX(ATT_{BIN})=\Sigma_{i=0}^{n}AS*2^{i} \quad (3)$$

where AS is the minimum attenuation step of the attenuator.

Figure 3:
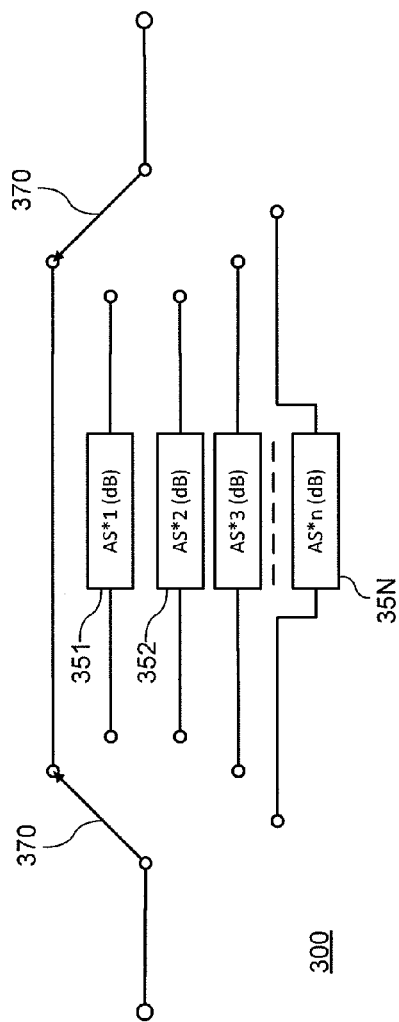
FIG. 3 is a schematic diagram of a thermometer coded attenuator.

FIG. 3 depicts a thermometer coded attenuator comprising a plurality of attenuator stages (or steps) 351, 352, . . . , 35N, any one of which may be selectively connected in the circuit by switch pair 370. The attenuation stages have attenuation levels that increase linearly in steps where each step is AS.

For the thermometer coded attenuator of FIG. 3, the maximum attenuation level is computed using equation (4):

$$MAX(ATT_{THERM})=AS*n \quad (4)$$

Figure 4:
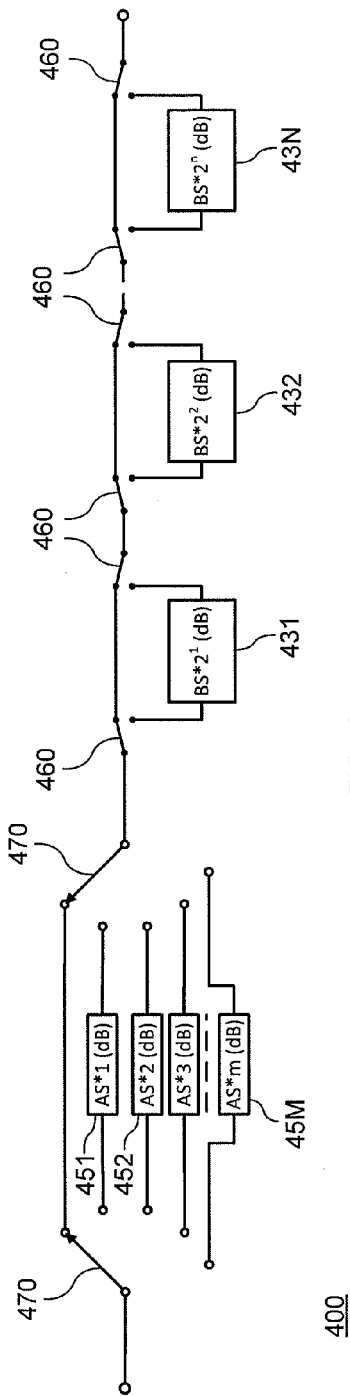
FIG. 4 is a schematic diagram of a thermometer coded and binary coded attenuator.

FIG. 4 depicts a thermometer coded and binary coded attenuator comprising a plurality of thermometer coded attenuator stages (or steps) 451, 452, . . . , 45M and a plurality of binary coded stages (or steps) 431, 432, . . . , 43N where the binary coded stages are connected in series with the thermometer coded stages. Any one of the stages of the thermometer coded attenuator may be selectively connected in the circuit by switch pair 470; and any one of the plurality of binary coded attenuator stages (or steps) may also be selectively connected in series by an appropriate pair of switches 460.

For the attenuator of FIG. 4, maximum attenuation is found using equation (5):

$$\text{MAX}(ATT_{MIX}) = AS*m + \Sigma_{i=1}^{n} BS*2^i \qquad (5)$$

where the minimum attenuator step is equal to AS and the binary step is given by $$BS = AS*m + 1 \qquad (6)$$

The main contributor to integrated noise power and transmit enable/disable spurious emissions on the output at low gain settings is the output gain stage. Bypassing the output gain stage when high gain is not needed avoids both issues. In accordance with the invention, this is done with each of the attenuator topologies depicted in FIGS. 2, 3, and 4.

Figure 5:
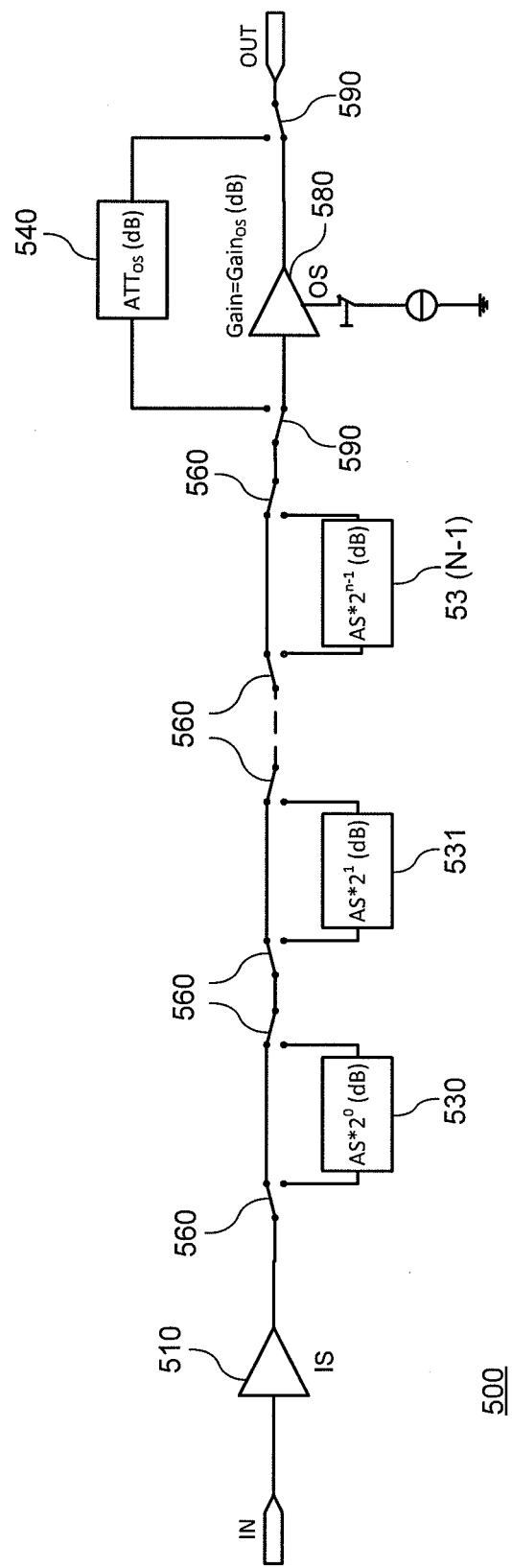
FIG. 5 is a schematic diagram of an illustrative embodiment of a binary coded attenuator of the invention.

FIG. 5 depicts an illustrative implementation of the invention using a binary coded attenuator. Amplifier 500 comprises an input amplifier gain stage (IS) 510, a plurality of binary coded attenuators 530, 531, . . . , 53(N−1), selectively connected by appropriate pairs of switches 560, an attenuator block $ATT_{OS}$ 540, and an output amplifier stage (OS) 580. Here, however, the output amplifier stage is a part of the binary weighted attenuator and together with attenuator block $ATT_{OS}$ 540 acts as one of the attenuation steps. When high gain is not needed and the attenuation level required is greater than $AS*2^n$, the output stage (OS) 580 is turned off and switched out while at the same time the attenuator block $ATT_{OS}$ 540 is switched in by switch pair 590. The $ATT_{OS}$ and $Gain_{OS}$ are chosen such that they satisfy equation (7)

$$-dB(\text{Gain}) - dB(ATT_{OS}) = AS*2^n \text{ (dB)} \qquad (7).$$

The maximum attenuation level is still given by equation (3) and is equal to $\Sigma_{i=0}^{n} AS*2^i$.

Figure 6:
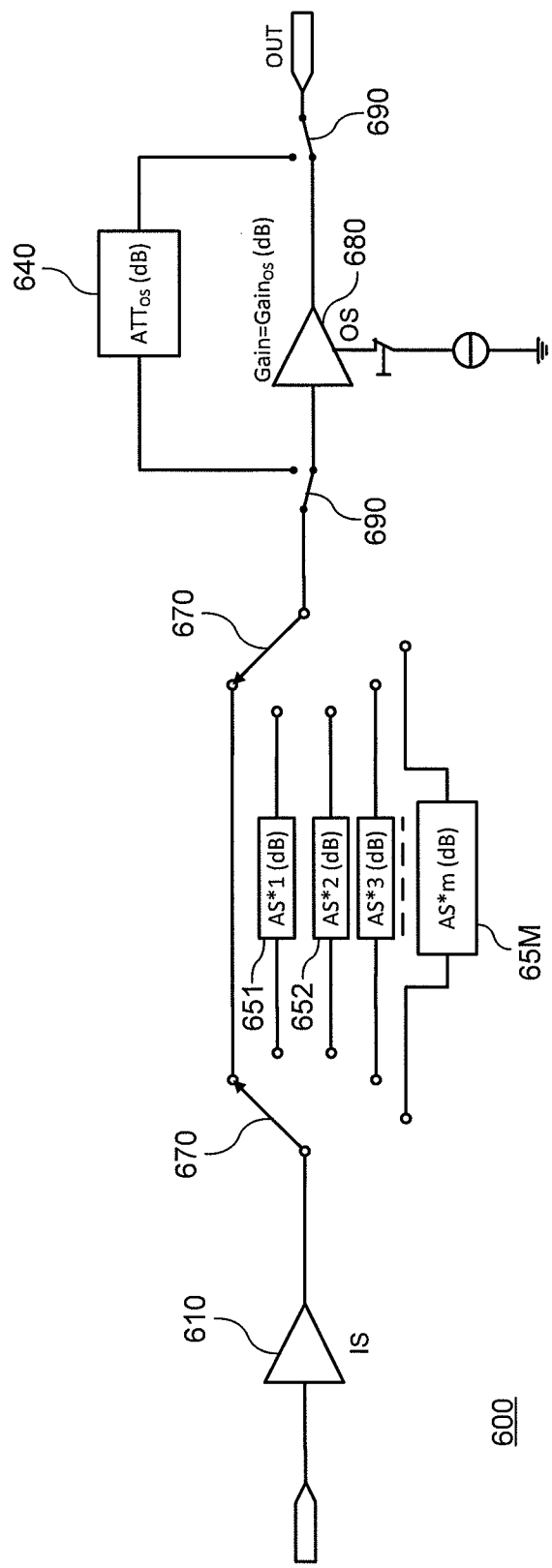
FIG. 6 is a schematic diagram of an illustrative embodiment of a thermometer coded attenuator of the invention.

FIG. 6 depicts an illustrative implementation of the invention using a thermometer coded attenuator. Amplifier 600 comprises an input amplifier gain stage (IS) 610, a plurality of thermometer coded attenuators 651, 652, . . . , 65M, selectively connected by switch pair 670, an attenuator block $ATT_{OS}$ 640, and an output amplifier stage (OS) 680. Once again, when high gain is not needed and the attenuation level required is greater than $AS*m$, the output stage OS is turned off and switched out while at the same time the attenuator block $ATT_{OS}$ 640 is switched in by switch pair 690. $ATT_{OS}$ and $Gain_{OS}$ are chosen such that they satisfy equation (8)

$$-dB(\text{Gain}_{OS}) - dB(ATT_{OS}) = AS*(m+1) \text{ (dB)} \qquad (8)$$

The maximum attenuation level of the circuit of FIG. 6 is given by:

$$\text{MAX}(ATT_{therm}) = AS*m + AS(m+1) = AS*(2*m+1) \qquad (9)$$

If we set $2*m+1=n$ then equation (8) becomes equal to equation (4).

Figure 7:
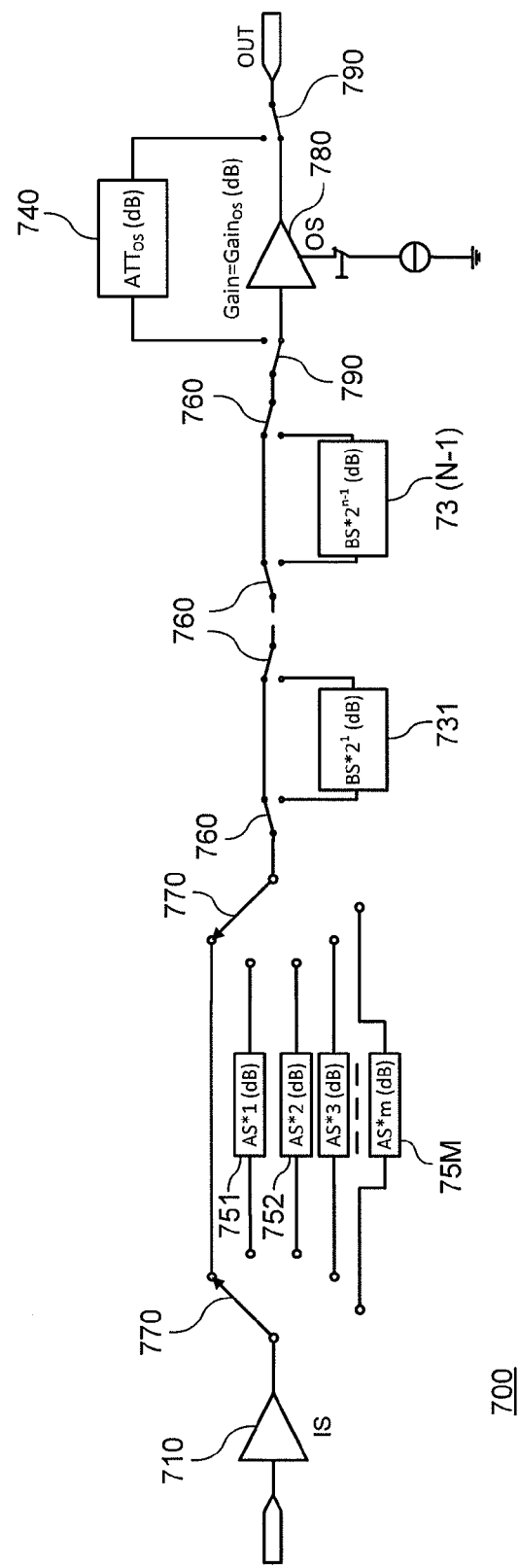
FIG. 7 is a schematic diagram of an illustrative embodiment of a thermometer coded/binary coded attenuator of the invention.

FIG. 7 depicts an illustrative implementation of the invention using a combination of a thermometer coded attenuator and a binary coded attenuator shown in FIG. 7. Amplifier 700 comprises an input gain stage (IS) 710, a first plurality of binary coded attenuators 731, . . . , 73(N−1), selectively connected by appropriate pairs of switches 760, a second plurality of thermometer coded switches 751, 752, 75M, selectively connected by switch pair 770, an attenuator block $ATT_{OS}$ 740, and an output amplifier stage (OS) 780.

Once again, when high gain is not needed and the required attenuation level is greater than $BS*2^n$, the output stage OS is turned off and switched out while at the same time the attenuator block $ATT_{OS}$ 740 is switched in by switch pair 790. $ATT_{OS}$ and $Gain_{OS}$ are chosen such that they satisfy equation (10)

$$-dB(\text{Gain}_{OS}) - dB(ATT_{OS}) = BS*2^n \text{ (dB)} \qquad (10)$$

The maximum attenuation level is still given by equation (5) which is repeated here for convenience.

$$\text{MAX}(ATT_{MIX}) = AS*m + \sum_{i=1}^{n} BS*2^i$$

The integrated output noise power for all three implementations (see FIGS. 5, 6, and 7) is given by equation (10).

$$NP_{OUT} = 10*\log(kTB) \qquad (11)$$

As will be apparent, this is a significant reduction compared to the integrated noise power given in equation (2). Also, since output stage OS is turned off, no spurious emissions related to OS are present at the output of the PGA during transmit enable/disable transition.

Another big advantage of this implementation is significantly reduced DC power consumption since most of the PGA power dissipation is related to OS biasing.

Figure 8:
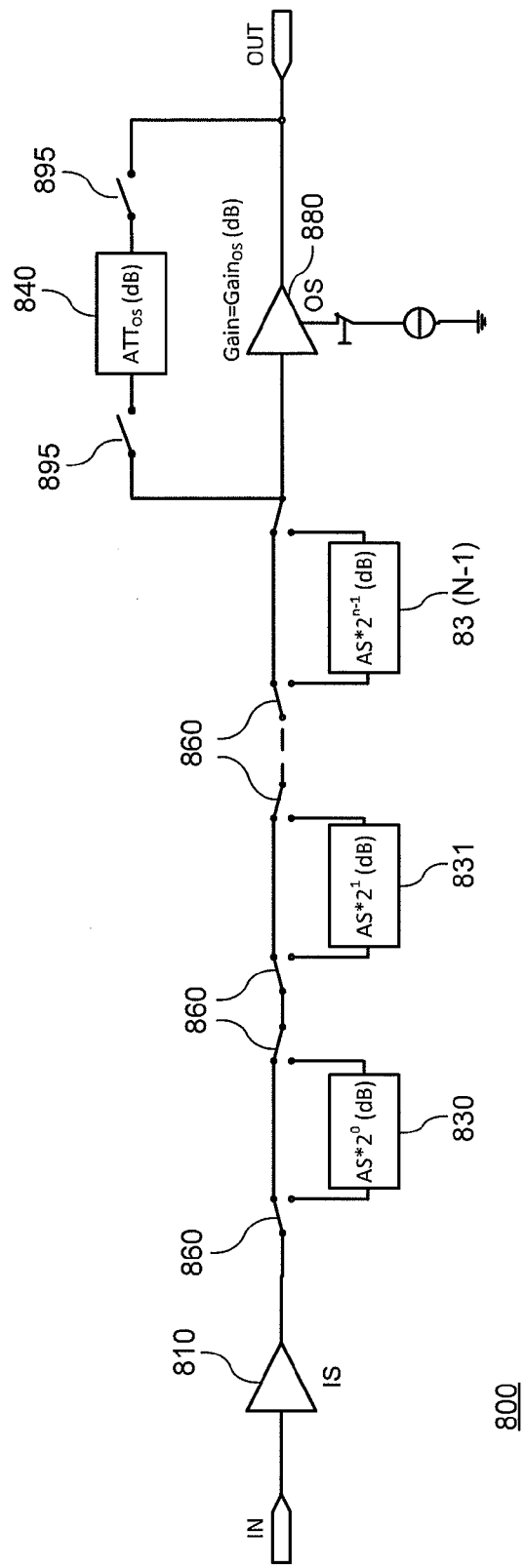
FIG. 8 is a schematic diagram of another illustrative embodiment of a binary coded attenuator of the invention.
Figure 9:
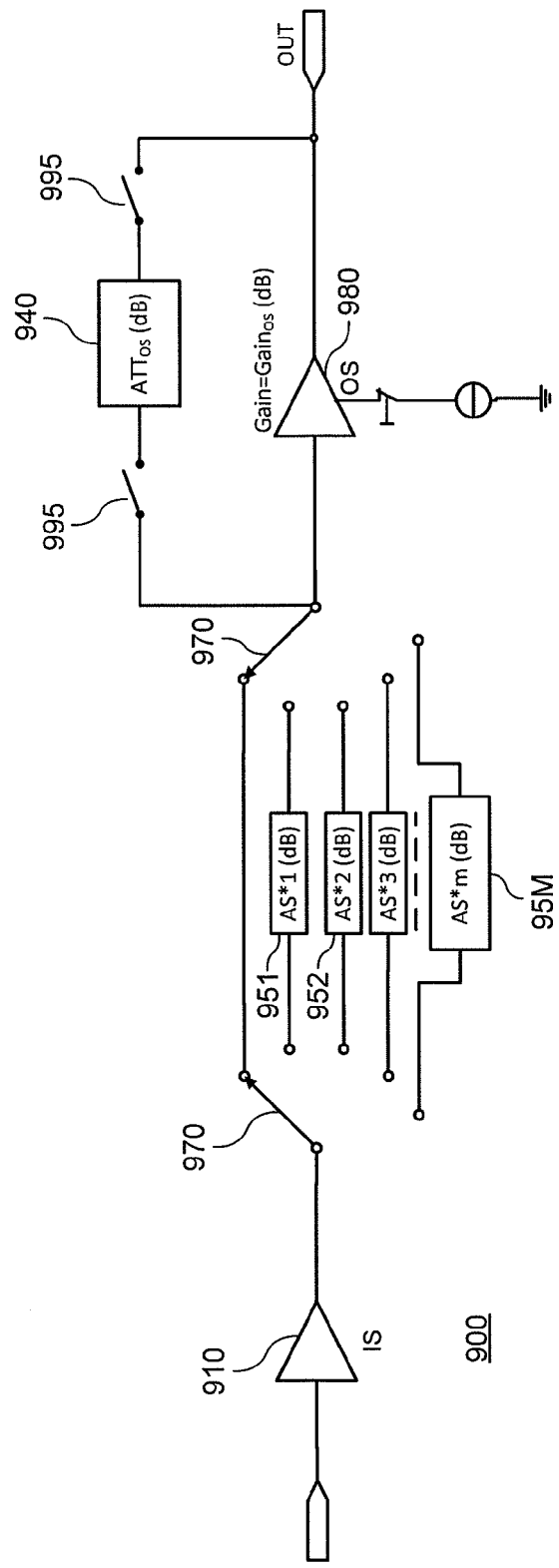
FIG. 9 is a schematic diagram of another illustrative embodiment of a thermometer coded attenuator of the invention.
Figure 10:
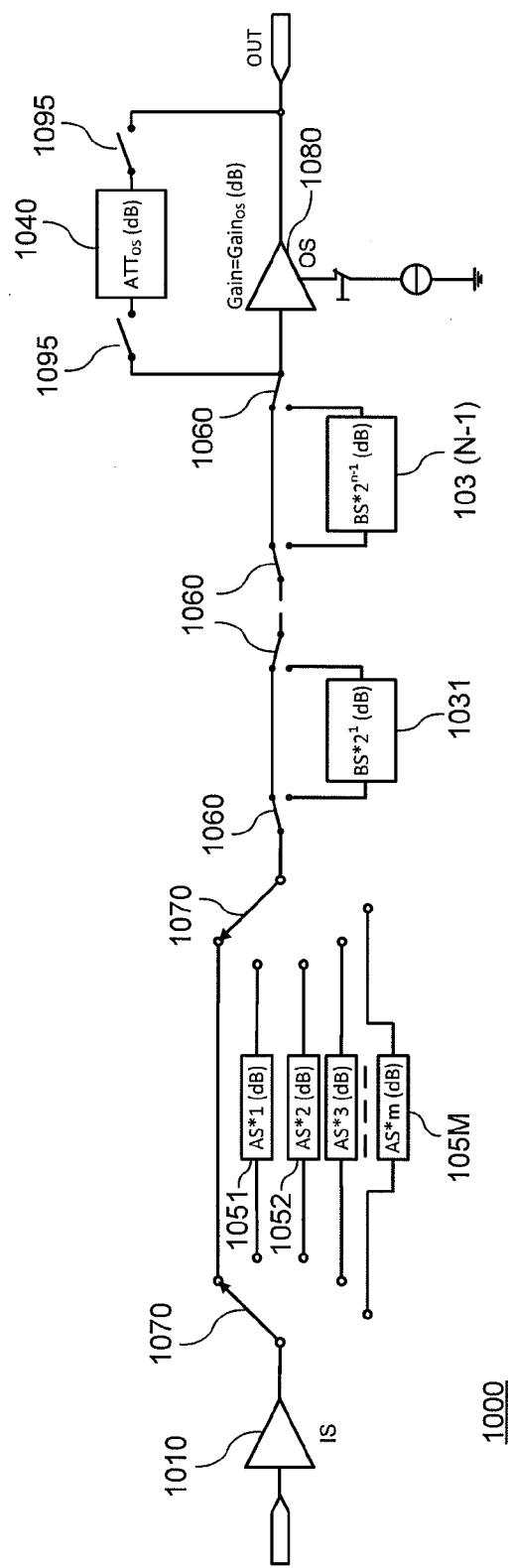
FIG. 10 is a schematic diagram of another illustrative embodiment of a thermometer coded/binary coded attenuator of the invention.

Alternatively, one may choose not to switch out the output stage but rather just turn it off and bypass it. FIGS. 8, 9 and 10 depict binary coded, thermometer coded and thermometer coded/binary coded circuits 800, 900, 1000 of this type. Except for switch pairs 895, 995, and 1095, the elements of FIGS. 8, 9 and 10 are the same as those of FIGS. 5, 6, and 7 and bear the same numbers increased by 300. Switch pairs 895, 995, and 1095 enable the final attenuator block 840, 940, 1040 to be selectively switched into the amplifier circuit, thereby bypassing the output stage which is turned off.

As will be apparent to those skilled in the art, numerous variations may be practiced within the spirit and scope of the present invention.

What is claimed is:

1. A broadband gain amplifier comprising:
   an input amplifier stage;
   a stepped attenuator comprising a thermometer coded attenuator that is connected in series with a binary coded attenuator having a plurality of binary attenuator steps that may be selectively connected in series;
   an attenuator block; and
   an output amplifier stage wherein the output amplifier stage can be selectively replaced by the attenuator block to produce an additional step of the stepped attenuator.

2. The amplifier of claim 1 wherein the stepped attenuator is a binary coded attenuator having a plurality of binary attenuator steps that may be selectively connected in series and the output amplifier stage is replaced to produce an additional step of the binary attenuator.

3. The amplifier of claim 2 wherein the output amplifier stage is replaced to produce the last in a series of binary attenuator steps.

4. The amplifier of claim 1 wherein the stepped attenuator is a thermometer coded attenuator having a plurality of steps any one of which may be selectively connected into the attenuator.

5. The amplifier of claim 4 wherein the steps of the thermometer coded attenuator have an attenuation that increases linearly.

6. The amplifier of claim 4 wherein the steps of the thermometer coded attenuator have an attenuation that increases the same amount for each step.

7. The amplifier of claim 1 wherein the output amplifier stage is replaced to produce the last in the series of binary attenuator steps.

8. A broadband gain amplifier comprising:

an input amplifier stage;

a stepped attenuator comprising a thermometer coded attenuator that is connected in series with a binary coded attenuator having a plurality of binary attenuator steps that may be selectively connected in series;

an attenuator block; and an output amplifier stage wherein the output amplifier stage can be selectively bypassed by the attenuator block to produce an additional step of the stepped attenuator.

9. The amplifier of claim 8 wherein the stepped attenuator is a binary coded attenuator having a plurality of binary attenuator steps that may be selectively connected in series and the output amplifier stage is bypassed to produce an additional step of the binary attenuator.

10. The amplifier of claim 9 wherein the output amplifier stage is bypassed to produce the last in a series of binary attenuator steps.

11. The amplifier of claim 8 wherein the stepped attenuator is a thermometer coded attenuator having a plurality of steps any one of which may be selectively connected into the attenuator.

12. The amplifier of claim 11 wherein the steps of the thermometer coded attenuator have an attenuation that increases linearly.

13. The amplifier of claim 11 wherein the steps of the thermometer coded attenuator have an attenuation that increases the same amount for each step.

14. The amplifier of claim 8 wherein the output amplifier stage is bypassed to produce the last in the series of binary attenuator steps.

15. A broadband gain amplifier comprising:

an input amplifier stage;

a binary coded attenuator coupled to an output of the amplifier stage, the binary coded attenuator having a plurality of binary attenuator steps that may be selectively connected in series;

an attenuator block; and an output amplifier stage wherein the output amplifier stage can be selectively replaced by the attenuator block to produce an additional binary coded attenuator step of the binary coded attenuator.

16. The amplifier of claim 15 wherein the output amplifier stage is replaced to produce the last in the series of binary coded attenuator steps.

17. The amplifier of claim 15 further comprising a thermometer coded attenuator that is connected in series between the input amplifier stage and the binary coded attenuator.

18. The amplifier of claim 17 wherein the steps of the thermometer coded attenuator have an attenuation that increases the same amount for each step.

19. A broadband gain amplifier comprising:

an input amplifier stage;

a binary coded attenuator coupled to an output of the amplifier stage, the binary coded attenuator having a plurality of binary attenuator steps that may be selectively connected in series;

an attenuator block; and an output amplifier stage wherein the output amplifier stage can be selectively bypassed by the attenuator block to produce an additional binary coded attenuator step of the binary coded attenuator.

* * * * *